(12) United States Patent
Sekine et al.

(10) Patent No.: US 8,609,999 B2
(45) Date of Patent: Dec. 17, 2013

(54) CIRCUIT BOARD, ELECTRONIC DEVICE AND METHOD FOR MANUFACTURING THE SAME

(75) Inventors: Shigenobu Sekine, Katsushika-ku (JP); Yurina Sekine, Katsushika-ku (JP); Yoshiharu Kuwana, Katsushika-ku (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 13/017,590

(22) Filed: Jan. 31, 2011

(65) Prior Publication Data

US 2011/0141704 A1   Jun. 16, 2011

Related U.S. Application Data

(63) Continuation of application No. 12/180,831, filed on Jul. 28, 2008, now Pat. No. 7,910,837.

(30) Foreign Application Priority Data

Aug. 10, 2007  (JP) ................. 2007-209696
May 15, 2008  (JP) ................. 2008-128462

(51) Int. Cl.
    *H05K 1/11*   (2006.01)
    *H01L 21/768*   (2006.01)

(52) U.S. Cl.
    CPC ................. *H01L 21/76898* (2013.01)
    USPC ........................ 174/262; 174/257

(58) Field of Classification Search
    CPC ................................. H01L 21/76898
    USPC .......... 174/260, 257, 259, 262; 228/224, 248; 420/557, 562
    See application file for complete search history.

(56) References Cited

U.S. PATENT DOCUMENTS

| 6,093,969 | A  | * | 7/2000  | Lin .............................. 257/777 |
| 6,264,093 | B1 |   | 7/2001  | Pilukaitis et al. |
| 7,681,777 | B2 | * | 3/2010  | Hirata et al. ................. 228/56.3 |
| 7,772,684 | B2 |   | 8/2010  | Kuramochi et al. |
| 2002/0162687 | A1 | * | 11/2002 | Akihiko ......................... 174/262 |
| 2003/0039811 | A1 | * | 2/2003  | Sugawa et al. ................ 428/209 |
| 2005/0174722 | A1 | * | 8/2005  | Hiranaka et al. .............. 361/600 |
| 2010/0159257 | A1 | * | 6/2010  | Yamaguchi et al. .......... 428/457 |
| 2011/0020171 | A1 | * | 1/2011  | Wada et al. ................... 420/470 |

FOREIGN PATENT DOCUMENTS

EP   2052805   *  4/2009
JP   7-142283     6/1995

(Continued)

OTHER PUBLICATIONS

U.S. Appl. No. 13/017,544, filed Jan. 31, 2011, Sekine, et al.

*Primary Examiner* — Yuriy Semenenko

(74) *Attorney, Agent, or Firm* — Oblon, Spivak, McClelland, Maier & Neustadt, L.L.P.

(57) ABSTRACT

A circuit board includes a substrate, a circuit pattern and a through electrode. The circuit pattern is disposed on one side of the substrate in a thickness direction thereof. The through electrode is filled in a through-hole formed in the substrate with one end connected to the circuit pattern. The circuit pattern and the through electrode each have an area containing a noble metal component (e.g., Au component) and are connected to each other therethrough.

10 Claims, 17 Drawing Sheets

(56) References Cited

FOREIGN PATENT DOCUMENTS

| | | |
|---|---|---|
| JP | 10-154417 | 6/1998 |
| JP | 11-33775 | 2/1999 |
| JP | 11-298138 | 10/1999 |
| JP | 2000-228410 | 8/2000 |
| JP | 2000-511466 | 9/2000 |
| JP | 2001-101925 | 4/2001 |
| JP | 2001-205477 | 7/2001 |
| JP | 2002-158191 | 5/2002 |
| JP | 2002-260444 | 9/2002 |
| JP | 2002-290052 | 10/2002 |
| JP | 2003-218200 | 7/2003 |
| JP | 2003-257891 | 9/2003 |
| JP | 2003-273155 | 9/2003 |
| JP | 2004-128042 | 4/2004 |
| JP | 2004-241479 | 8/2004 |
| JP | 2005-64451 | 3/2005 |
| JP | 2005-123250 | 5/2005 |
| JP | 2005-303258 | 10/2005 |
| JP | 2005-353785 | 12/2005 |
| JP | 2006-12734 | 1/2006 |
| JP | 2006-32695 | 2/2006 |
| JP | 2006-111896 | 4/2006 |
| JP | 2006111896 * | 4/2006 |
| JP | 2006-257408 | 9/2006 |
| JP | 2006294600 * | 10/2006 |
| JP | 2007-73918 | 3/2007 |
| JP | 2007-81053 | 3/2007 |
| JP | 2007-96226 | 4/2007 |
| JP | 2007-96232 | 4/2007 |
| JP | 2007-250867 | 9/2007 |
| JP | 2008-38163 | 2/2008 |
| JP | 2008-78657 | 4/2008 |
| WO | WO 97/43081 | 11/1997 |

* cited by examiner

CIRCUIT BOARD, ELECTRONIC DEVICE AND METHOD FOR MANUFACTURING THE SAME

CROSS-REFERENCE TO RELATED APPLICATIONS

This application is a Continuation application of application Ser. No. 12/180,831 filed Jul. 28, 2008, which claims the benefit of priority from prior Japanese Application Nos. 2008-128462 filed May 15, 2008 and 2007-209696 filed Aug. 10, 2007, respectively. Further, the entire contents of application Ser. No. 12/180,831 is herein incorporated by reference.

BACKGROUND OF THE INVENTION

1. Field of the Invention

The present invention relates to a circuit board, an electronic device and a method for manufacturing the same.

2. Description of the Related Art

Examples of electronic device include various scales of integrated circuits and various types of semiconductor devices and chips thereof.

As means for realizing a three-dimensional circuit configuration in electronic devices of this type, there has been adopted a method that LSIs are disposed on a circuit board with multilayered wiring therebetween. However, this method increases the mounting area with the number of LSIs, so that the signal delay between LSIs increases because of an increase in wiring length.

Accordingly, there has been proposed a technology of using a circuit board with a circuit pattern disposed on one side and through electrodes passing therethrough in a thickness direction and connected to the circuit pattern.

As one example of such circuit boards, Japanese Unexamined Patent Application Publication No. 11-298138 discloses a process of filling an adhesive liquid material into through-holes or non-through-holes of a multilayered circuit board, wherein after the adhesive liquid material is screen-printed on the circuit board under an vacuum atmosphere, differential-pressure filling is performed by reducing the vacuum degree of the vacuum atmosphere or changing the vacuum atmosphere to a normal atmosphere.

In addition, Japanese Unexamined Patent Application Publication No. 2000-228410 discloses a process of forming through electrodes, wherein through-holes of a high-aspect ratio are formed in a circuit board by an optical excitation electropolishing method, an oxide film as an insulating layer is formed by oxidizing the inner wall of the through-holes, and then the through-holes are filled with a metal by a melted metal refilling process.

Japanese Unexamined Patent Application Publication No. 2002-158191 discloses a process of filling a metal into micropores through a difference in an ambient pressure, while Japanese Unexamined Patent Application Publication No. 2003-257891 discloses a process of filling a conductive paste into micropores. Moreover, Japanese Unexamined Patent Application Publication No. 2006-111896 discloses a process of forming through electrodes, wherein a metal is directly embedded into through-holes before and after a plate embedding stage.

As means for realizing a structure in which through electrodes are connected to a circuit pattern in electronic devices of the type, there are two main types of method. The first method is to previously form through electrodes, which contain Sn (tin) as a main component, on a circuit board and then form a circuit pattern. The second method is to previously form a circuit pattern on a circuit board, perforate through-holes in the circuit board at locations corresponding to the circuit pattern, and then filling a molten metal material such as Sn (tin) into the through-holes for formation of through electrodes.

The circuit pattern is formed by using a thin-film formation technique such as CVD (Chemical Vapor Deposition) or sputtering. Such thin-film formation techniques expose the circuit board to a high temperature. When using the first method, accordingly, the through electrodes containing Sn as a main component melt in the thin-film formation process.

When using the second method, on the other hand, since the through electrodes are formed after formation of the circuit pattern, the problem of melting of the through electrodes in the first method can be avoided. The second method is superior to the first method in that point.

However, although the process of forming the circuit pattern on one side of the circuit board is carried out under a vacuum atmosphere, the circuit board is taken out into the air in the following processes of forming the through-holes and filling the molten metal material thereinto. This results in oxidizing the surface of the circuit pattern at the inner bottom surface of the through-holes.

Oxidation of the surface of the circuit pattern to be connected to the through electrodes deteriorates the connection between the circuit pattern and the through electrodes, thereby causing serious problems that cannot be overlooked in electronic devices of this type, such as insufficient properties and a decrease in yield.

As means for solving the oxidation problem, there has been known a technique of reducing the oxide film of the circuit pattern by using the reduction action of a flux.

However, the above reduction technique using a flux causes the following serious problem. In detail, filling the flux into the through-holes along with the molten metal material generates a flux gas. In electronic devices of this type, the through-holes are micropores having a diameter of, for example, several tens of μm and a significantly high aspect ratio. If a flux gas is generated in such through-holes, the escape of gas inevitably becomes difficult, producing voids due to the flux gas around the through electrodes, which leads to a decrease in cross-sectional area of the through electrodes, an increase in electrical resistance, poor connection to the circuit pattern, and an increase in bond resistance.

SUMMARY OF THE INVENTION

It is an object of the present invention to provide a circuit board suppressing formation of an oxide film on a surface of a circuit pattern, an electronic device, and a method for manufacturing the same.

It is another object of the present invention to provide a circuit board suppressing formation of voids within a through-hole, an electronic device, and a method for manufacturing the same.

In order to achieve at least one of the above objects, the present invention provides a circuit board comprising a substrate, a circuit pattern, and a through electrode. The circuit pattern is disposed on one side of the substrate in a thickness direction thereof, and the through electrode is filled in a through-hole formed in the substrate with one end connected to the circuit pattern. The circuit pattern and the through electrode each have an area containing a noble metal component and are connected to each other therethrough.

The circuit board according to the present invention may be combined with a circuit functional part to provide an electronic device.

When manufacturing the circuit board according to the present invention, at first, a substrate with a circuit pattern on one side thereof is prepared. Then, a through-hole is perforated in the substrate at a location corresponding to the circuit pattern, wherein the through-hole extends from the other side of the substrate to the circuit pattern. Then, metal particles are supplied into the through-hole, wherein the metal particles have a noble metal disposed at least on a surface thereof. Then, a molten metal material is filled into the through-hole to form a through electrode.

According to the above manufacturing method, even if the surface of the circuit pattern is oxidized at the bottom of the through-hole, the metal particles with a noble metal appearing on their surface can be melted by a melting heat energy at the step of filling a molten metal material into the through-hole for formation of the through electrode, thereby thermally diffusing into the circuit pattern and the through electrode. As a result, the circuit pattern and the through electrode each have an area where a noble metal component is dispersed in its composition and are connected to each other through the noble metal component-dispersed areas.

Noble metal materials generally have a higher melting point than materials of the through electrode, but the melting point can be significantly lowered by reducing the particles to a nano-size, allowing the noble metal materials to be melted by a heat transferred from the molten materials of the through electrode.

The oxide film, which has been produced on the surface of the circuit pattern at the bottom of the through-hole before filling the molten metal material of the through electrode, can be reduced by catalysis of the noble metal particles. Thus, since the reduction does not need any flux, formation of voids due to a flux gas can be avoided.

As another aspect of the present invention, the through electrode may contain bismuth (Bi), gallium (Ga) and antimony (Sb). In the case of containing bismuth (Bi), gallium (Ga) and antimony (Sb), it is possible to eliminate voids from the resulting through electrode by using their cubical expansion properties.

As further aspect of the present invention, the through electrode may contain a magnetic component such as iron (Fe), cobalt (Co), nickel (Ni) and alloys thereof. With these magnetic components, there may be adopted a filling method using a magnetic force in a filling process for formation of the through electrode.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

Circuit Board

Figure 1:
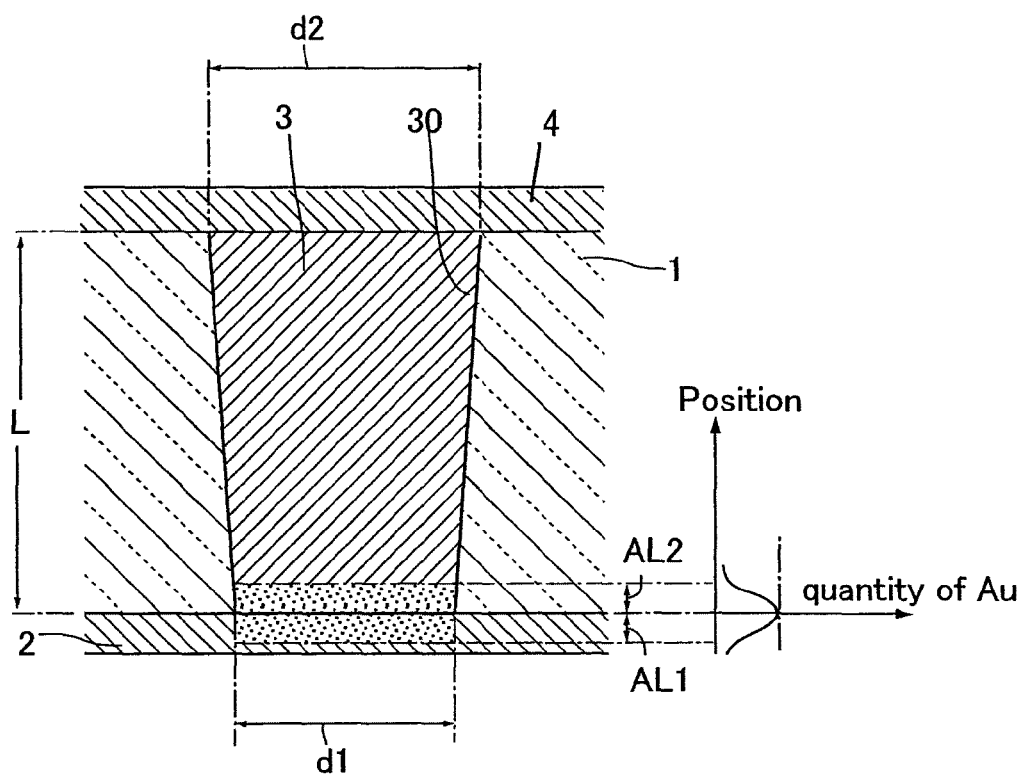
FIG. 1 is a sectional view schematically showing a structure of a circuit board according to one embodiment of the present invention.

Referring to FIG. 1, there is shown a circuit board having a simple configuration, but in practice, it has a more complicated configuration so as to satisfy functional and structural requirements depending on the type of the circuit board. The illustrated circuit board has a three-dimensional circuit configuration composed of a substrate 1, a circuit pattern 2 and a through electrode 3. The substrate 1 may be various types of semiconductor substrates, a dielectric substrate, an insulating substrate or a magnetic substrate. In the illustrate embodiment, the substrate 1 is a semiconductor substrate, e.g., a silicon wafer. In the case of a semiconductor substrate, an insulating film is disposed on both sides and an interface between the through electrode 3 and the substrate 1. The insulating film may be a film of a metal oxide such as $SiO_2$ and $Al_2O_3$ and can be formed with a required thickness (depth) at a required location through a known chemical treatment.

The circuit pattern 2 is a thin-film disposed on at least one side of the substrate 1. In FIG. 1, another circuit pattern 4 is disposed on the other side of the substrate 1. The circuit pattern 2 may take various plane patterns depending on the functional requirements. If necessary, the circuit pattern 2 may be surrounded by an insulating film. The circuit pattern 2 may be composed of a known material such as a metal material containing a copper (Cu) as a main component. If necessary, it may also contain indium (In), aluminum (Al) and bismuth (Bi). The circuit pattern 2 may be formed by using a thin-film formation technique such as CVD or sputtering. These thin-film formation techniques are to deposit a thin-film under a vacuum atmosphere while heating.

The through electrode 3 is filled in a through-hole 30 extending from one side of the substrate 1 in the thickness direction and having one end connected to the circuit pattern 2. The through electrode 3 may be composed of a metal material containing tin (Sn) as a main component and optionally indium (In), aluminum (Al), bismuth (Bi), gallium (Ga) and antimony (Sb). In the case of containing bismuth (Bi), gallium (Ga) and antimony (Sb), it is possible to eliminate voids from the resulting through electrode 3 by using their cubical expansion properties. If necessary, these materials of cubical expansion properties may be combined with noble metal components.

The through electrode 3 may further contain a magnetic component such as iron (Fe), cobalt (Co), nickel (Ni) and alloys thereof. With these magnetic components, there may be adopted a filling method using a magnetic force in a filling process for formation of the through electrode. If necessary, these magnetic components may be combined with noble metal materials and the above materials of cubical expansion properties.

Moreover, the through electrode 3 may contain a combination of at least one kind of high melting metal particles selected from the group consisting of silver (Ag), copper (Cu), gold (Au), platinum (Pt), titanium (Ti), zinc (Zn), Aluminum (Al), iron (Fe), silicon (Si) and nickel (Ni) and at least one kind of low melting metal particles selected from the group consisting of Tin (Sn), indium (In) and bismuth (Bi). This will be described later in detail.

In the illustrated embodiment, a single through electrode 3 is provided for one circuit pattern 2, but it is also possible to provide a plurality of through electrodes 3 for one circuit pattern 2. The through-hole 30 has a depth L and a diameter d1 at its bottom, wherein, preferably, the diameter d1 is 100 µm or less and an aspect ratio (L/d) is 1 or more, more preferably, the diameter d1 is 25 µm or less and the aspect ratio (L/d) is 5 or more. Such a through-hole 30 can be formed, for example, by laser piercing or chemical treatment. The through-hole 30 is shaped to satisfy d2>d1, i.e., the diameter d2 at its upper open end is larger than the diameter d1 at its bottom.

The circuit pattern 2 and the through electrode 3 have dispersed areas AL1, AL2 containing a common noble metal component and are connected to each other through the dispersed areas AL1, AL2. The noble metal component is dispersed to have such a concentration gradient that its content (dispersed amount) is the highest at but decreases with distance from the interface between the dispersed areas AL1, AL2. In FIG. 1, the dispersed areas AL1, AL2 are defined by an alternate long and short dash line as if they were a defined area, but this is merely for purposes of illustration. Actually, they don't have such a definite boundary.

Examples of noble metal include gold (Au), silver (Ag), platinum (Pt), palladium (Pd), rhodium (Rh), iridium (Ir), ruthenium (Ru) and osmium (Os). Among them, the dispersed areas AL1, AL2 preferably contain at least one component selected from the group consisting of gold (Au), silver (Ag), platinum (Pt), palladium (Pd) and alloys thereof.

With this configuration, the through electrode 3 can be connected to the circuit pattern 2 without leaving any oxide film on the surface of the circuit pattern 2. The circuit pattern 2, which has been formed under a vacuum atmosphere with the above-described thin-film formation techniques, is prevented from oxidizing during the film formation process, but exposed to the air during the process of forming the through-hole 30 and the through electrode 3, thereby oxidizing through the through-hole 30. However, even if an oxide film is produced on the surface of the circuit pattern 2, as described above, the noble metal component, for example, gold (Au) thermally diffuses into the metal components constituting the circuit pattern 2, so that the oxide film can be reduced by catalysis of the noble metal. Accordingly, the through electrode 3 can be connected to the circuit pattern 2 without leaving any oxide film on the surface of the circuit pattern 2.

In addition, since the reduction of the oxide film, which is due to the catalysis of the noble metal, does not need any flux, formation of voids due to a flux gas can be avoided.

The circuit board according to the present invention may be embodied in various forms with respect to the through electrode structure. FIGS. 2 to 5 illustrate such embodiments. In FIGS. 2 to 5, the portions corresponding to those shown in FIG. 1 are indicated by the same reference symbols. It should be noted that as the materials constituting the through electrode, the above-mentioned noble metal materials, materials of cubical expansion properties and magnetic materials can be used, of course, but other materials may also be used without limitation.

Figure 2:
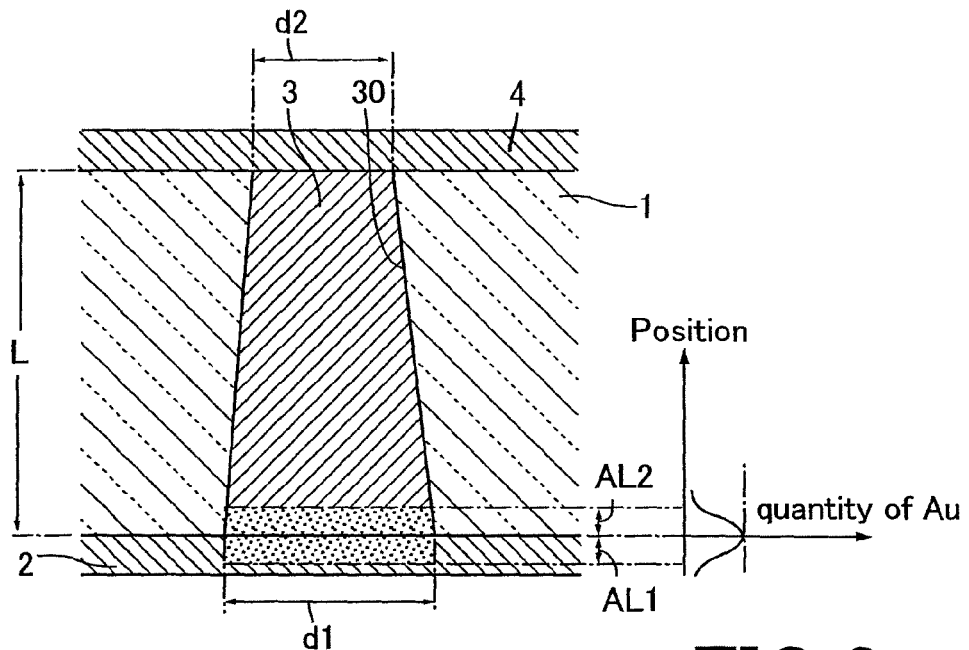
FIG. 2 is a sectional view schematically showing another structure of a circuit board according to one embodiment of the present invention.

First referring to FIG. 2, the through-hole 30 satisfies d1>d2, where d1 represents a diameter at the bottom and d2 represents a diameter at the upper open end. With this configuration, the through electrode 3 is prevented from coming out of the through-hole 30 toward the upper open end.

Figure 3:
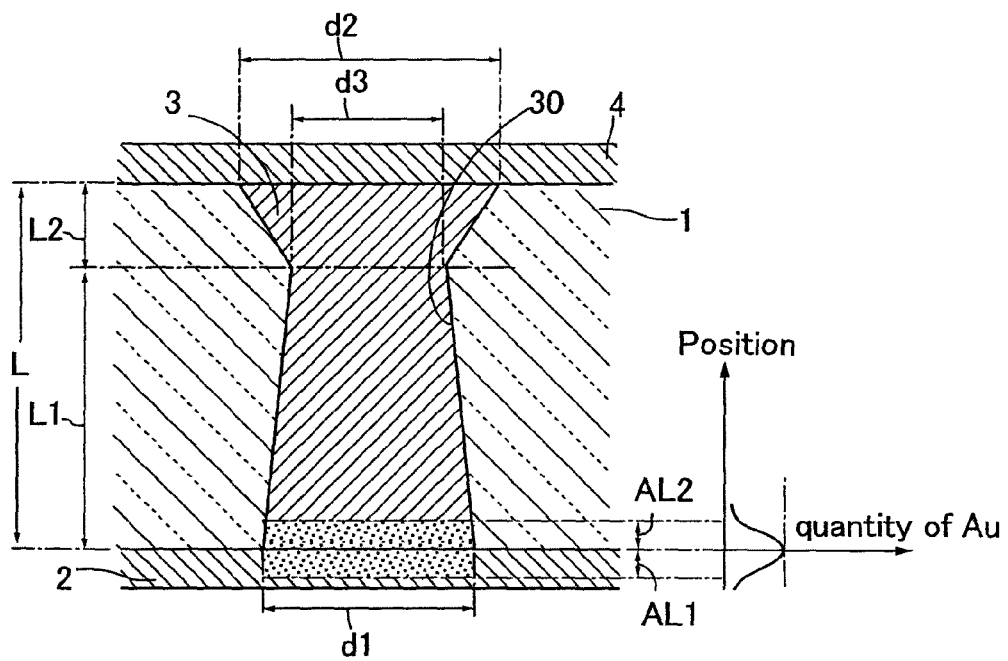
FIG. 3 is a sectional view schematically showing still another structure of a circuit board according to one embodiment of the present invention.

Next referring to FIG. 3, the through-hole 30 has a constriction at a mid-portion, more specifically, at a height L1 from the bottom. The constriction has a diameter d3 that is smaller than the diameter d1 at the bottom (i.e., d1>d3). This configuration also provides the same effects as that of FIG. 2.

The diameter of the through-hole 30 gradually increases upwardly at the portion having a height L2 (=L−L1) between the constriction of the diameter d3 and the upper open end, so that the upper open end has a diameter d2 that is larger than the diameter d3 (i.e., d2>d3). With this configuration, since the molten metal and the like can be filled from the upper open end of a larger diameter d2 in the process of forming the through electrode, the filling process becomes easy. The diameter d2 may be larger or smaller than the diameter d1 at the bottom.

Figure 4:
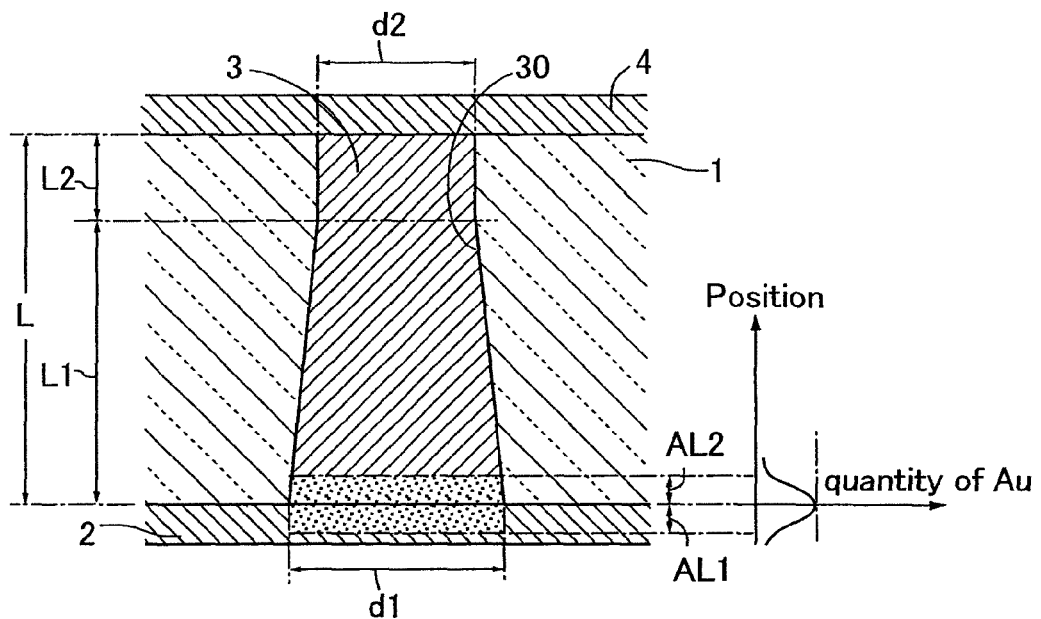
FIG. 4 is a sectional view schematically showing yet another structure of a circuit board according to one embodiment of the present invention.

Referring to FIG. 4, the through-hole 30 also has a constriction at a mid-portion, more specifically, at a height L1 from the bottom. The constriction has a diameter d3 that is smaller than the diameter d1 at the bottom (i.e., d1>d3), as in FIG. 3. However, the through-hole 30 of FIG. 4 is different from that of FIG. 3 in that the upper portion from the constriction to the upper open end extends straight with a constant diameter equal to the diameter d3.

Figure 5:
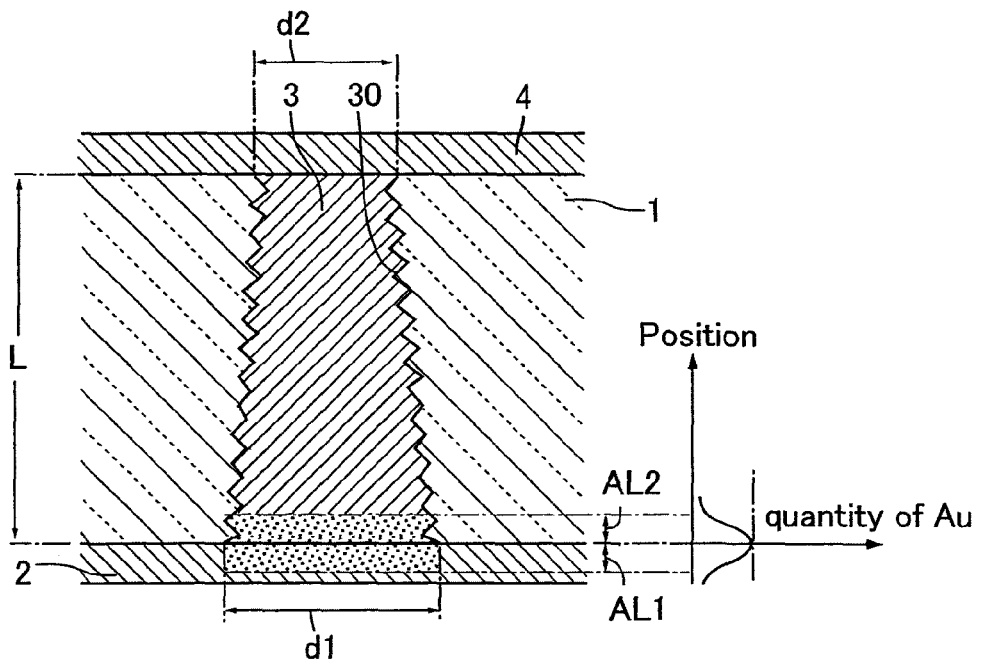
FIG. 5 is a sectional view schematically showing yet another structure of a circuit board according to one embodiment of the present invention.

Further referring to FIG. 5, the through-hole 30 has a roughened inner wall surface. The degree of roughness is preferably such that the ratio of a height h1 of the roughened surface, as measured from the bottom of the valley to the top of the hill, to the diameter d3 at the upper open end (i.e., h1/d3) falls within the range of $\frac{1}{40}$ to $\frac{4}{40}$.

In the embodiments of FIGS. 1 to 5, the through-hole 30 may be a round hole, an elliptical hole, a square hole or a combination thereof, and may have various diameters.

Next will be concretely described effects of the present invention with reference to experimental data shown in FIGS. 6 to 12 and in comparison with a conventional circuit board. The experimental data were obtained from the embodiment of FIG. 1.

Figure 6:
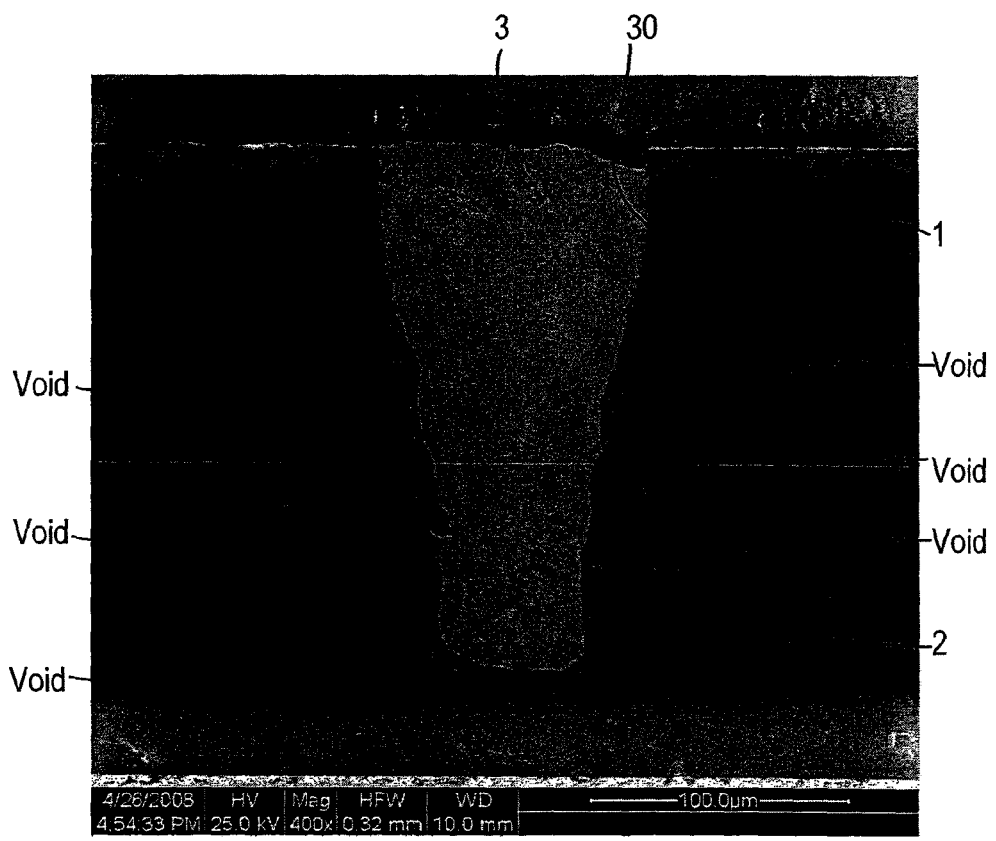
FIG. 6 is a SEM (Scanning Electron Microscope) photograph of a conventional circuit board as a comparative example.
Figure 7:
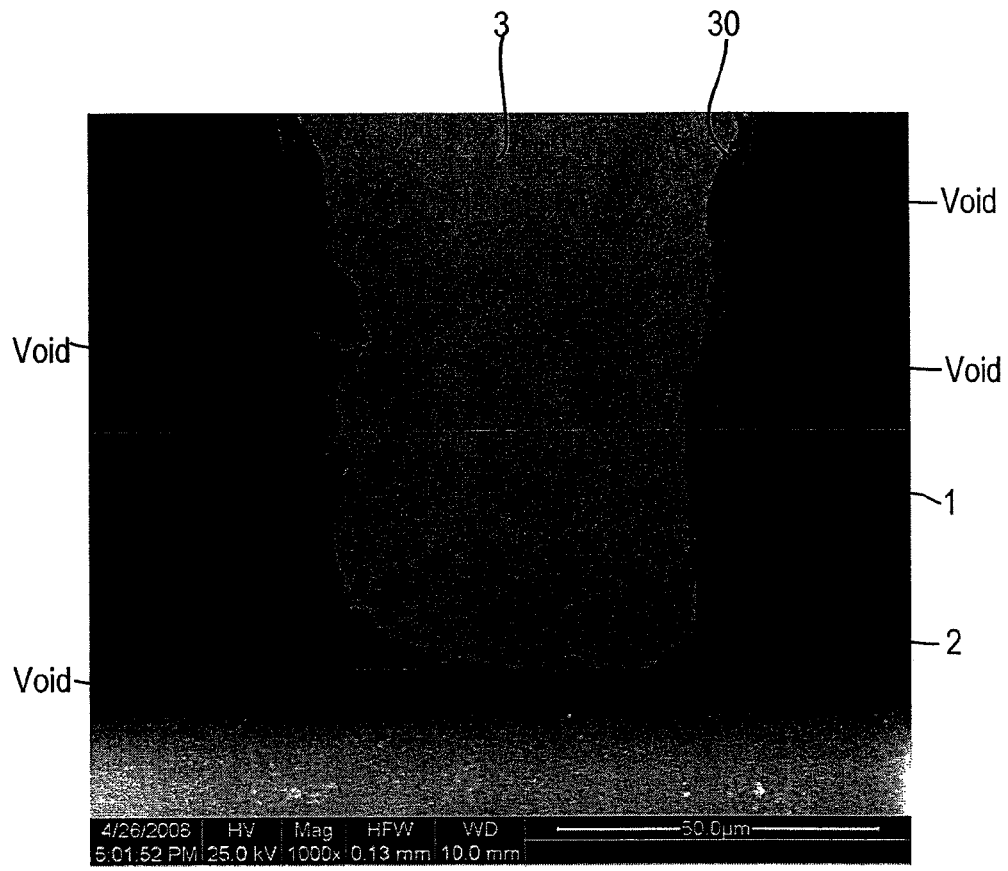
FIG. 7 is an enlarged SEM photograph of FIG. 6.

The circuit board shown in FIGS. 6 and 7 had a structure in which a circuit pattern 2 containing Cu as a main component was disposed on one side of a silicon substrate 1 with one end of a through electrode 3 directly connected to the circuit pattern 2. A flux was used for reducing an oxide film on the surface of the circuit pattern 2, and a molten electrode material containing molten Sn as a main component was filled into a through-hole 30 for formation of the through electrode 3.

As seen from FIGS. 6 and 7, considerably large voids were formed between the periphery of the through electrode 3 and the inner wall surface of the through-hole 30. Although the flux reduction technique can reduce the oxide film on the surface of the circuit pattern 2, the flux filled into the through-hole 30 along with the molten metal material generates a flux gas. In circuit boards of this type, the through-hole 30 is a micropore having a diameter of, for example, several tens of μm and a significantly high aspect ratio. Accordingly, if a flux gas is generated in such a through-hole 30, the escape of gas inevitably becomes difficult, forming voids due to the flux gas around the through electrode 3, which leads to a decrease in cross-sectional area of the through electrode 3, an increase in electrical resistance, poor connection to the circuit pattern 2, and an increase in bond resistance.

Figure 8:
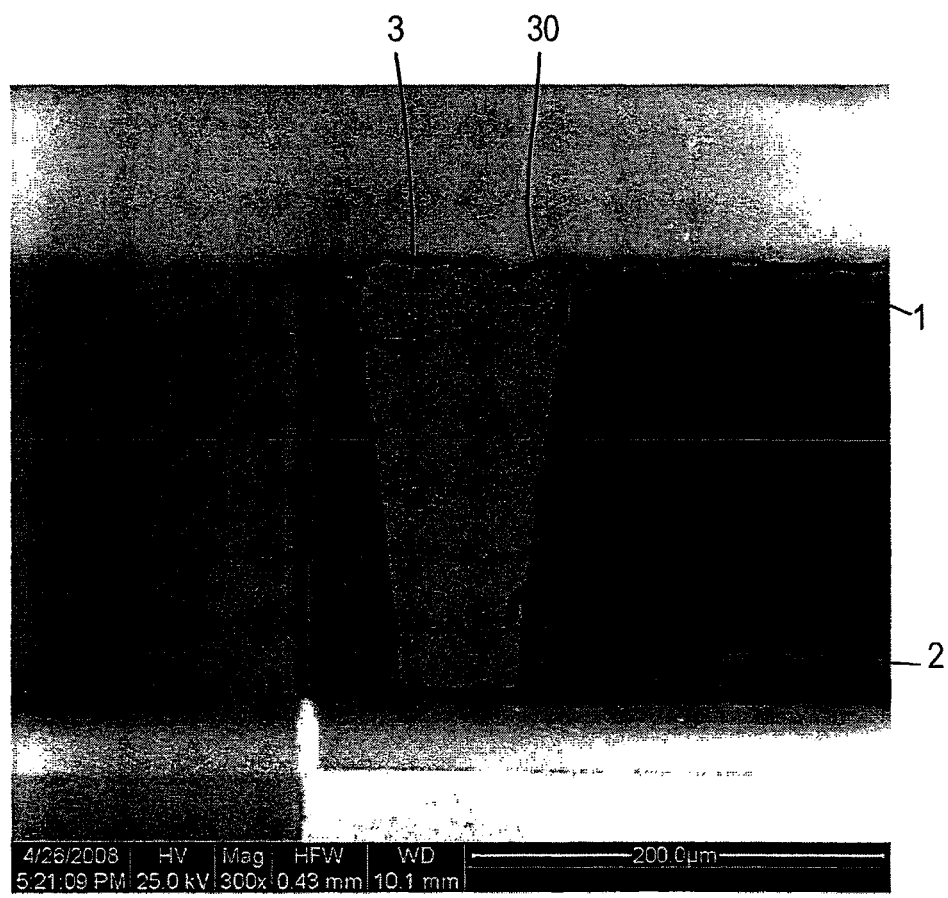
FIG. 8 is a SEM photograph of a circuit board according to one embodiment of the present invention.
Figure 9:
FIG. 9 is an enlarged SEM photograph of FIG. 8.
Figure 10:
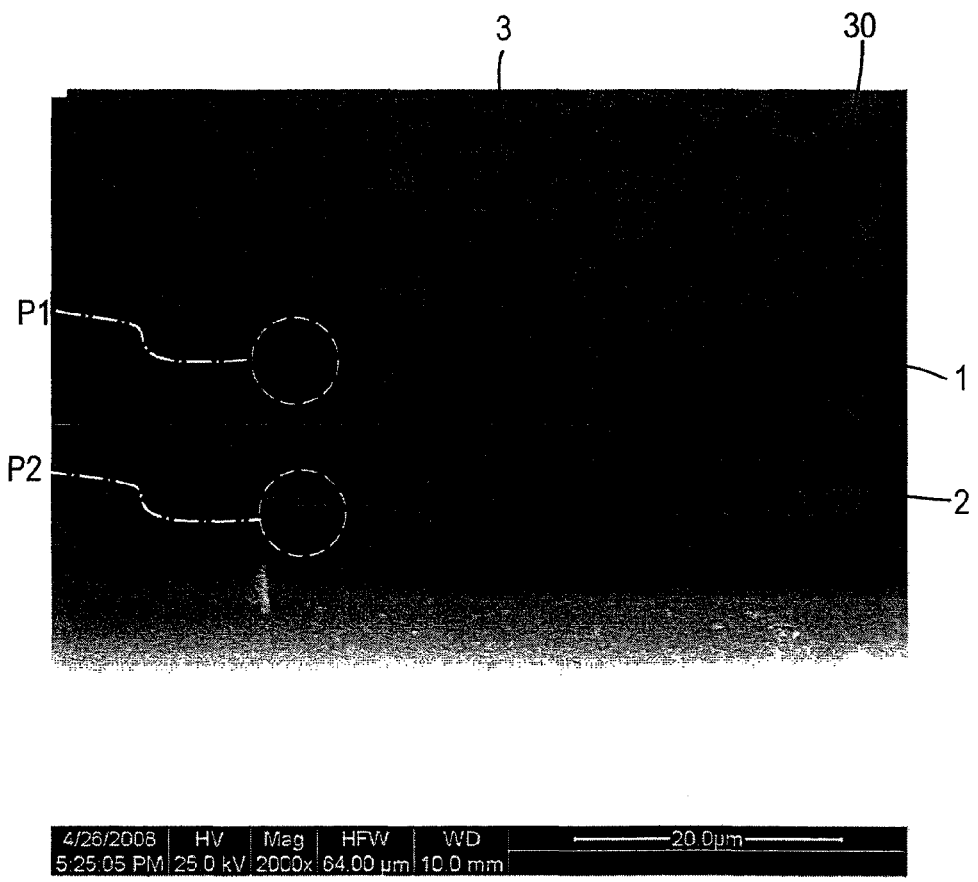
FIG. 10 is a further enlarged SEM photograph of FIG. 8.

In the circuit board according to the present invention, on the other hand, the periphery of the through electrode 3 was in close contact with the inner wall surface of the through-hole 30 formed in the substrate 1, leaving little voids therebetween, as shown in FIGS. 8 to 10. Although a shadow like a void can be seen between the circuit pattern 2 and the contact surface of the through electrode 3, this shadow is not a void but a chip created by polishing when taking a SEM photograph.

Figure 11:
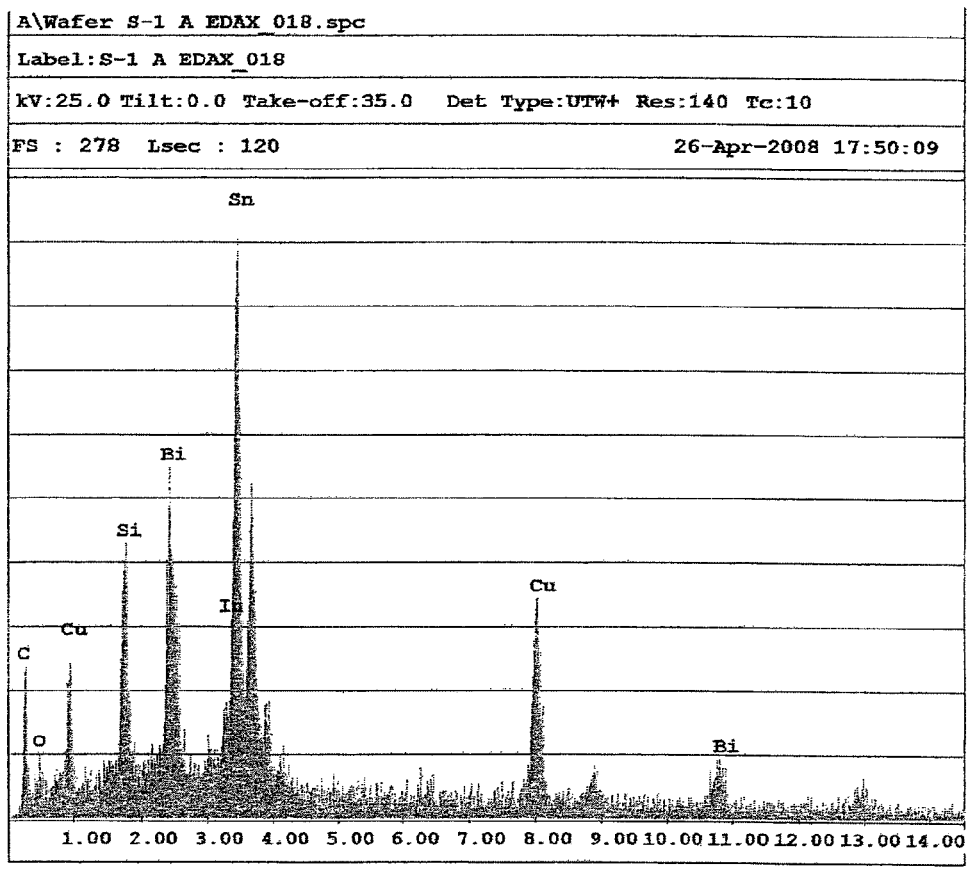
FIG. 11 is a graph showing results obtained by analyzing a P1 area of FIG. 10 using an EDAX (Energy-dispersive Analysis of X-rays) apparatus.

Referring to FIG. 11 showing results obtained by analyzing a P1 area of FIG. 10 using an EDAX apparatus, it is seen that the P1 area, which was a center area of the through electrode 3, contained Sn as a main component and also In, Cu and Bi.

Figure 12:
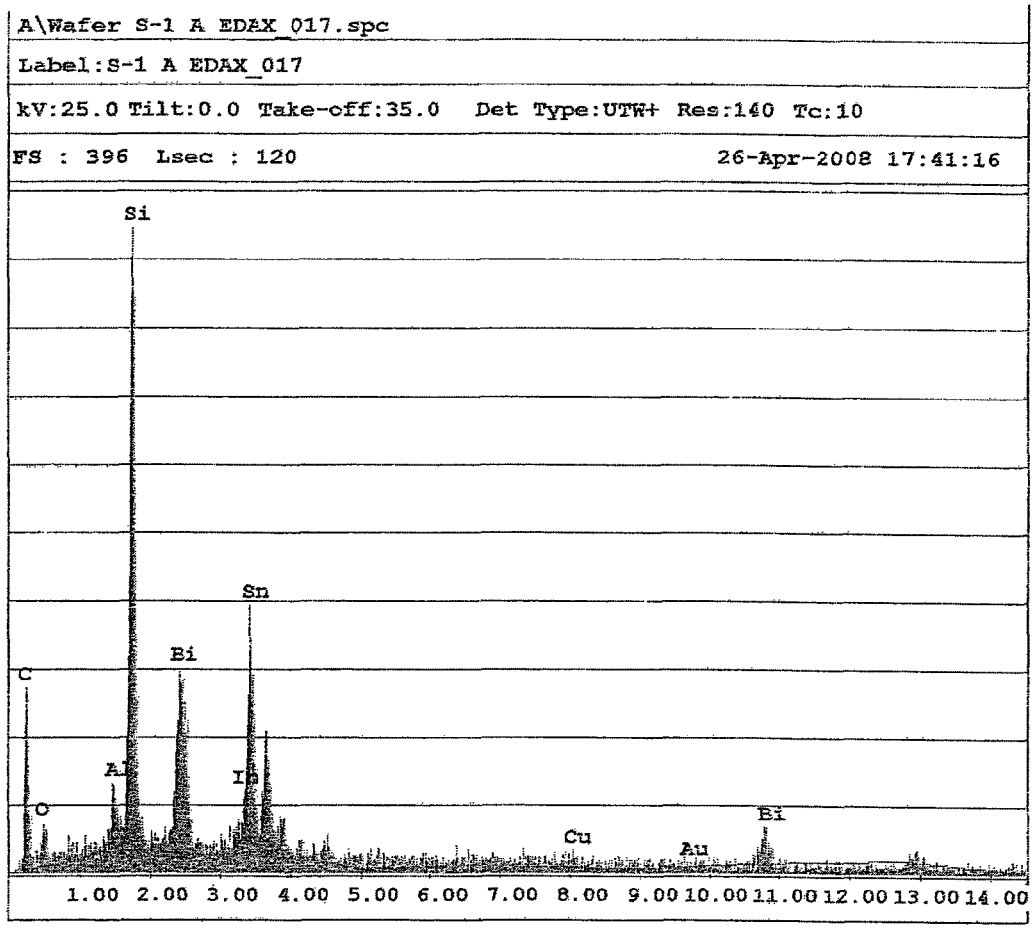
FIG. 12 is a graph showing results obtained by analyzing a P2 area of FIG. 10 using an EDAX apparatus.

Next referring to FIG. 12, it is seen that a P2 area, which was a portion of the through electrode 3 located close to the silicon substrate 1, further contained Au. With respect to Sn being a main component of the through electrode 3, the row of SnL shows 17.42 wt. % and 3.29 at. %. With respect to Au, on the other hand, the row of AuL shows 1.24 wt. % and 0.14 at. %. As understood from this, Au was dispersed in the through electrode 3 in a minute amount of 1.24 wt. % and 0.14 at. %.

When the through electrode 3 contains Bi, since the volume of Bi increases by about 3 to 3.5% upon solidification from the molten state, the voids, which would otherwise be formed between the inner wall surface of the through-hole 30 and the through electrode 3 filled in the through-hole 30, can be eliminated by the cubical expansion of Bi.

When containing Sn, In, Cu and Bi, it has been confirmed that containing 20 wt. % or more of Bi, 30 wt. % or less of In, 30 wt. % or less of Sn, and 1 to 5 wt. % of Cu is extremely effective in preventing the formation of voids.

The synergy between the void formation preventing effect due to containing Bi and the void formation preventing effect due to not using a flux brings the through electrode 3 into close contact with the inner surface of the through-hole 30. Similar cubical expansion effects can be expected from using gallium (Ga) or antimony (Sb) other than Bi.

Figure 13:
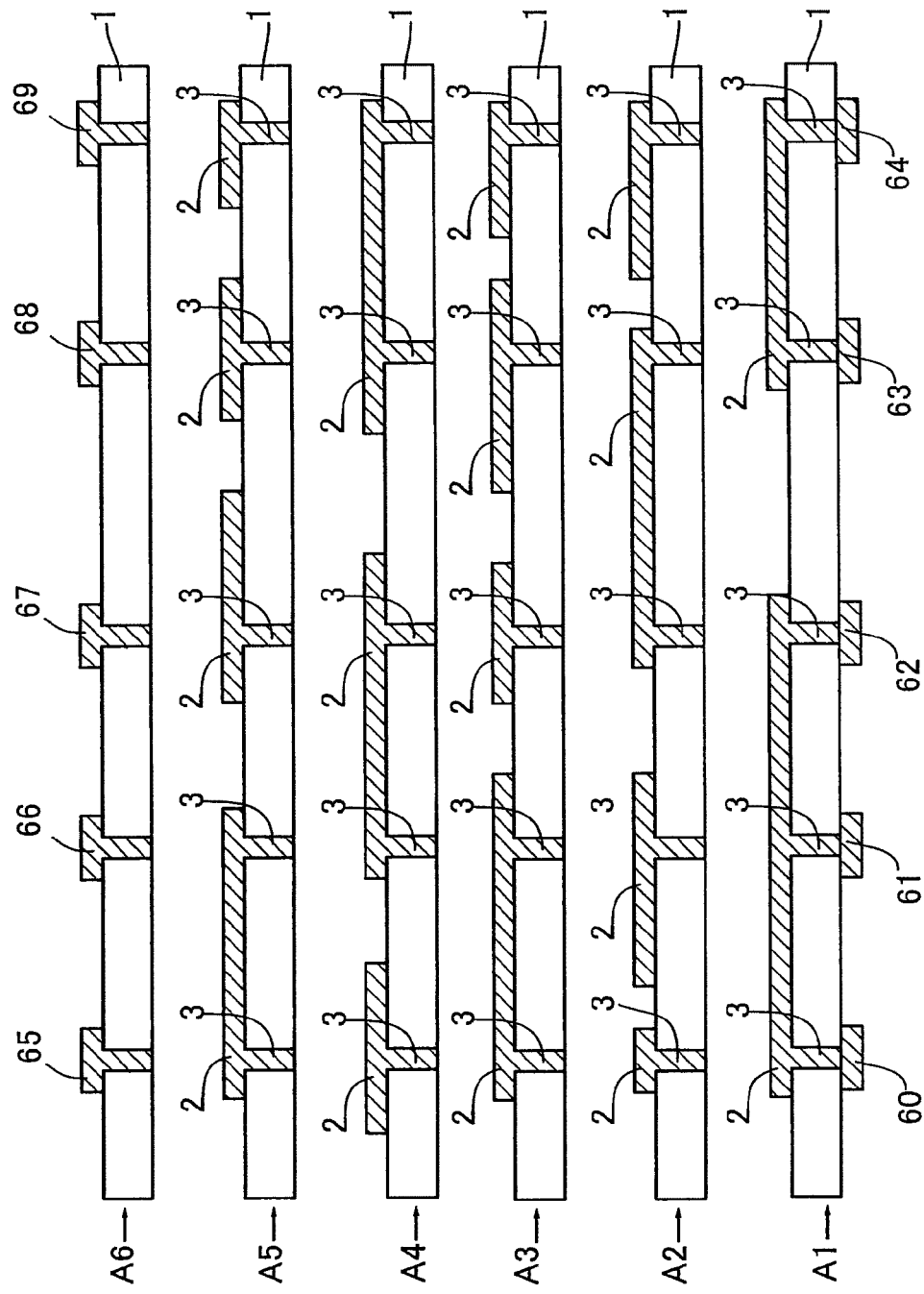
FIG. 13 is an exploded diagram of a circuit board according to another embodiment of the present invention.
Figure 14:
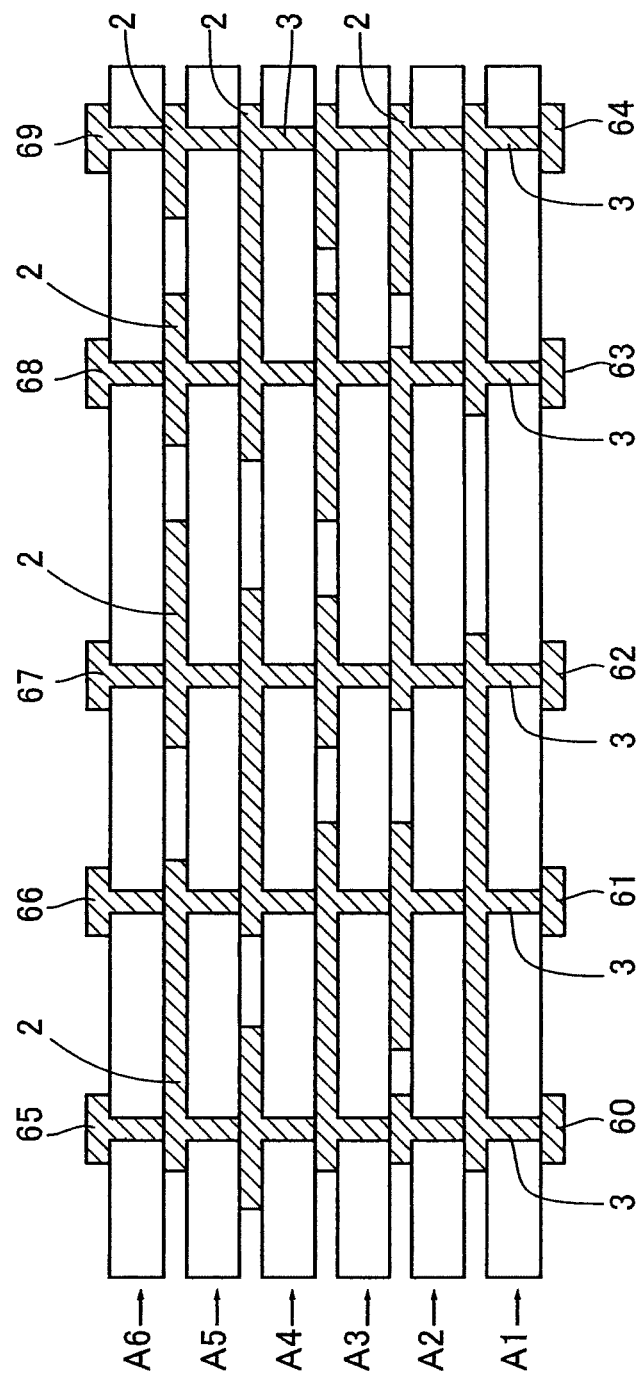
FIG. 14 is a diagram schematically showing a structure of the circuit board shown in FIG. 13.

FIGS. 13 and 14 show a multilayered circuit board having a multilayered structure of an arbitrary number of circuit boards A1 to A6, wherein at least one layer may adopt the structure having the circuit pattern 2 and the through electrode 3.

In the illustrated embodiment, each of the circuit boards A1 to A6 adopts the structure having the substrate 1 with the circuit pattern 2 and the through electrode 3. The circuit pattern 2 is formed on one side of each of the circuit boards A1 to A6. Some of the circuit patterns 2 extend over a few adjacent through electrodes 3.

The circuit boards A1 to A6 are bonded to one another at their interfaces through an adhesive. In the drawings, all the through electrodes 3 are connected to one another between the circuit boards A1 to A6, but may not be connected to one another depending on the circuit configuration. In addition, the outermost circuit boards A1 and A6 are provided with bumps (output electrodes) 60 to 69 as necessary. The multilayered structure shown in FIGS. 13 and 14 is suitable for realizing a circuit board of a complicated three-dimensional circuit configuration.

(Manufacturing Method)

Figure 15:
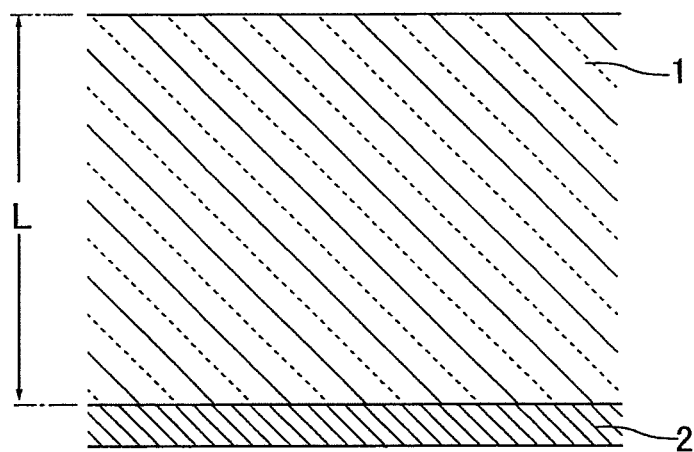
FIG. 15 is a diagram showing one step for manufacturing a circuit board according to one embodiment of the present invention.

Next will be described a method for manufacturing a circuit board according to the present invention with reference to FIGS. 15 to 21. First of all, there is prepared a substrate 1 (wafer) with a circuit pattern 2 formed on one side, as shown in FIG. 15. The circuit pattern 2 may be formed by adopting a thin-film formation technique such as CVD or sputtering.

Figure 16:
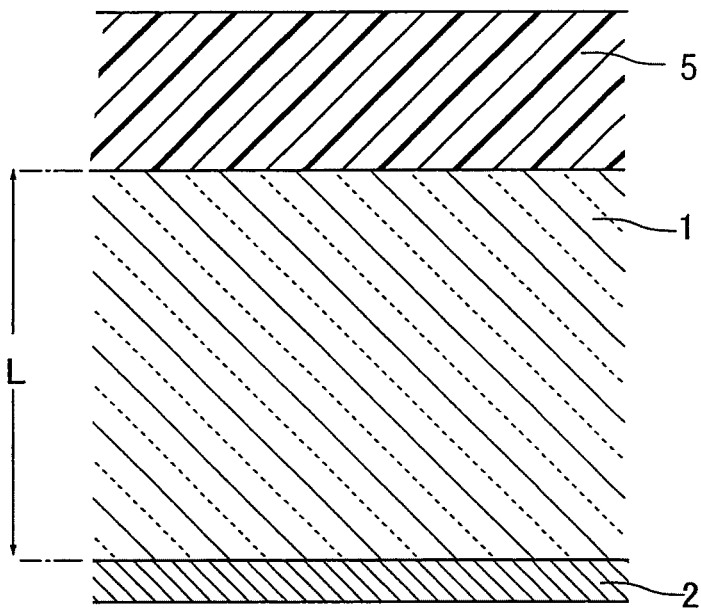
FIG. 16 is a diagram showing a step after the step shown in FIG. 15.
Figure 17:
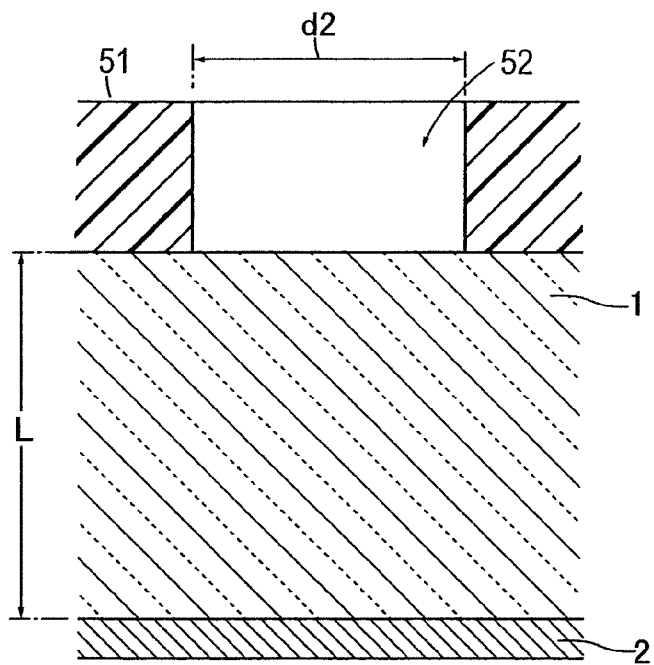
FIG. 17 is a diagram showing a step after the step shown in FIG. 16.

Then, a resist 5 is applied to the other side of the substrate 1, as shown in FIG. 16, and then, a known photolithography process is performed to form a resist mask 51 that has an opening of a diameter d2, as shown in FIG. 17.

Figure 18:
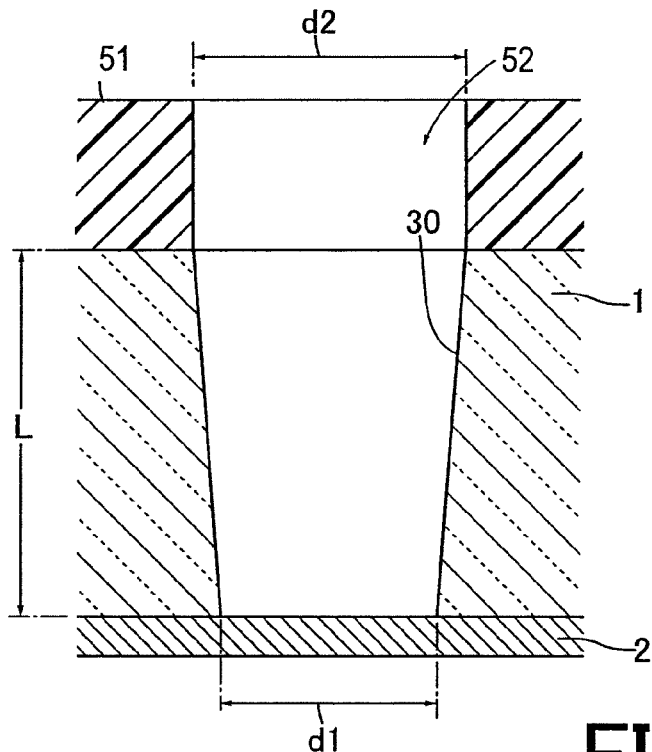
FIG. 18 is a diagram showing a step after the step shown in FIG. 17.

Subsequently, a through-hole 30 is formed within the opening of the resist mask 51, for example, by using a laser irradiation or a chemical reaction etching method, as shown in FIG. 18. The through-hole 30 is formed such that the surface of the circuit pattern 2 is exposed at the bottom of a diameter d1.

Figure 19:
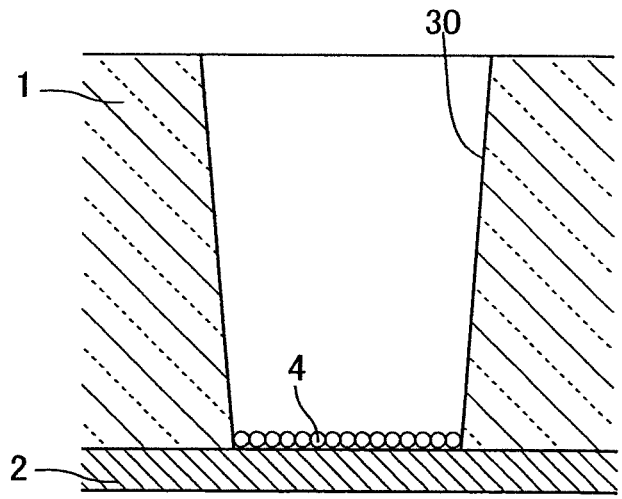
FIG. 19 is a diagram showing a step after the step shown in FIG. 18.

Subsequently, metal particles 4, at least the surface of which is covered with a noble metal, are supplied into the through-hole 30 using a screen printing method or the like, as shown in FIG. 19. In the screen printing process, the screen printing may be performed while applying an ultrasonic vibration to the substrate 1 or a sqeegee (not shown).

The metal particles 4 may be entirely composed of a noble metal or may have a core of Sn or the like whose surface is covered with a noble metal. For the metal particles 4, magnetic particles may also be used as a core whose surface is covered with a noble metal. In this case, the magnetic particles may have a grain size of 1 μm or less and be composed of at least one component selected from the group consisting of iron (Fe), cobalt (Co), nickel (Ni) and alloys thereof.

Moreover, the metal particles 4 may be nanoparticles so as to utilize the melting point lowering effect due to a nano size. For example, the metal particles 4 may be supplied in such a minute amount as to form only about one to three layers of metal particles on the surface of the circuit pattern 2.

Figure 20:
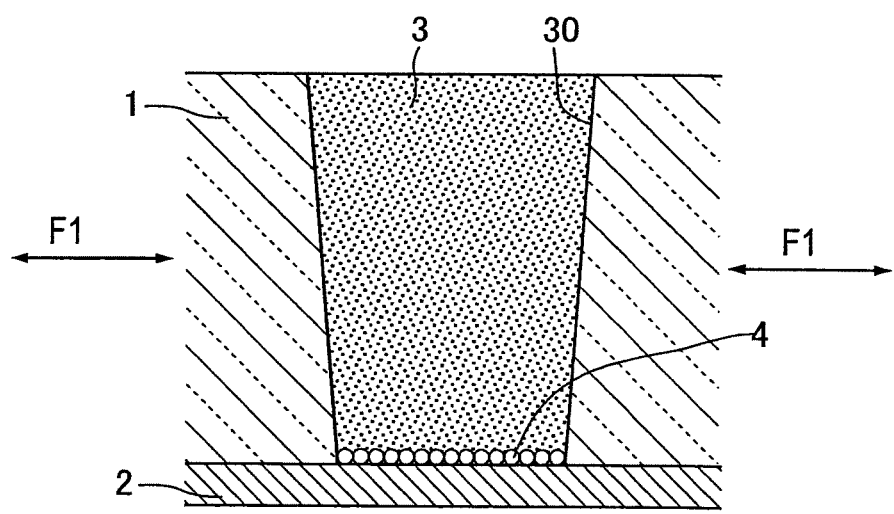
FIG. 20 is a diagram showing a step after the step shown in FIG. 19.
Figure 21:
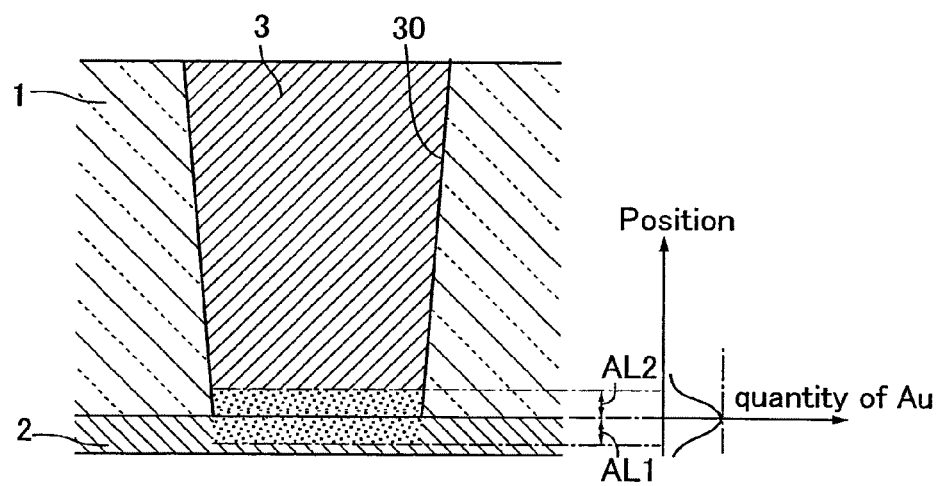
FIG. 21 is a diagram showing a step after the step shown in FIG. 20.

Subsequently, a molten metal material is filled into the through-hole 30 to form a through electrode 3, as shown in FIG. 20. In this process, the circuit board is placed under a vacuum atmosphere within a vacuum chamber and the molten metal material is filled into the through-hole 30 through the pressure of the molten flow, while applying an ultrasonic vibration F1 to the substrate 1 (wafer). When filling the metal material, powder is melted on the circuit board 1 and impregnated into the micropores through the flow velocity, melting and vibration. Then, differential-pressure filling is performed by reducing the vacuum degree of the vacuum atmosphere or changing the vacuum atmosphere to a normal atmosphere.

Also in the differential-pressure filling, an ultrasonic vibration is applied. The fluid pressure can be controlled by adjusting the operation of a rotating screw or a pump.

Instead of the differential-pressure filling, there may be adopted centrifugal filling which utilizes a centrifugal force during a rotation of the substrate 1 for filling of the molten metal material. Also in the centrifugal filling, an ultrasonic vibration is applied as in the differential-pressure filling.

As has been described hereinabove, the molten metal material may contain at least one component selected from the group consisting of bismuth (Bi), gallium (Ga) and antimony (Sb) and may optionally be combined with the above-mentioned noble metal components.

The molten metal material may further contain Fe, Co, Ni and alloys thereof. In this case, instead of the differential-pressure filling, there may be adopted magnetic filling which applies an external magnetic field to the substrate 1 and utilizes its magnetic force to facilitate filling of the molten metal material. Also in the magnetic filling, an ultrasonic vibration is applied as in the differential-pressure filling and centrifugal filling. As has been described hereinabove, if necessary, the magnetic components may be combined with the noble metal components and the materials of cubical expansion properties. Since the magnetic components have a higher melting point than other components constituting the molten metal material such as Sn, they can remain solid in the shape of particles within the molten metal material. The grain size of the magnetic components is preferably 1 μm or less.

In the molten metal filling process, the noble metal component, for example, gold (Au) can be alloyed by receiving a melting heat energy and thermally diffusing into the metal components constituting the circuit pattern 2. At this time, an oxide film formed on the surface of the circuit pattern 2 can be reduced by catalysis of the noble metal. Accordingly, the through electrode 3 can be connected to the circuit pattern 2 without leaving any oxide film on the surface of the circuit pattern 2.

In addition, since the reduction of the oxide film, which is due to the catalysis of the noble metal, does not need any flux, formation of voids due to a flux gas can be avoided. Similar effects can be obtained by using Ag, Pt or Pd instead of Au.

Moreover, unlike the process of forming a thin-film of a fine multilayered structure using a photolithography process and a thin-film formation technique, it is not technically difficult and does not require heavy investment in facilities to adopt differential-pressure filling, centrifugal filling or magnetic filling in combination with applying an ultrasonic vibration to the substrate 1 (wafer) for filling the molten metal material into the through-hole 30. This enables cost reduction.

The molten metal material to be filled preferably contains high melting metal particles and low melting metal particles. The high melting metal particles may contain at least one component selected from the group consisting of Ag, Cu, Au, Pt, Ti, Zn, Al, Fe, Si and Ni. The low melting metal particles may have a composite structure and contain at least one component selected from the group consisting of Sn, In and Bi. The composite structure refers to a composite containing at least one of single crystal, polycrystal and amorphous. Preferably, the composite contains polycrystal and single crystal.

The advantage of using the molten metal material containing the high melting metal particles and the low melting metal particles is that although the metal material contains the high melting metal particles, thermal melting upon filling can be performed at a temperature higher than the melting point of the low melting metal particles but lower than the melting point of the high melting metal particles. Such a low-temperature heat treatment melts only the low melting metal particles. This provides a filling structure in which voids between the high melting metal particles are filled up with the molten low melting metal particles, so that intermetallic bond dramatically improves conductivity.

When Ag is used as the high melting metal particles, migration of Ag can be reliably prevented because the surface of Ag is covered with the low melting metal particles.

When Cu is used as the high melting metal particles, oxidation of Cu can be prevented because Cu is covered with the molten low melting metal particles, as in the case of Ag.

The low melting metal particles have a composite structure. When the low melting metal particles having a composite structure are used for a conductive pattern, different crystal structures can coexist in a molten state without mixing with each other, thereby preventing disconnection due to a crack.

Preferably, the ratio of the high melting metal particles to the whole quantity of the conductive particles is 50 to 80 wt. %, while the ratio of the low melting metal particles to the whole quantity of the conductive particles is 20 to 50 wt. %. If the ratio of the high melting metal particles to the whole quantity of the conductive particles is less than 50 wt. %, their high conductivity cannot contribute to the whole conductive composition. If the ratio of the high melting metal particles to the whole quantity of the conductive particles is more than 80 wt. %, on the other hand, since the amount of the low melting metal particles is insufficient, the high melting metal particles may remain uncovered with the low melting metal particles and voids may be formed in the conductive layer, easily causing the problems of Ag migration and being unable to prevent oxidation of Cu.

Preferably, the high melting metal particles have a grain size of less than 20 nm. If the high melting metal particles have such a minute grain size, they can be filled into a through-hole of a small diameter.

(Electronic Device)

Examples of electronic device according to the present invention include almost everything that uses an electronic circuit as a functional element, such as a sensor module, an optoelectronic module, a unipolar transistor, a MOS-FET, a CMOS-FET, a memory cell, a FC (Field Complementary) chip, integrated circuit, components thereof, and various scales of LSIs.

Particularly, an integrated circuit adopting a circuit board according to the present invention as an interposer is appropriate as a typical example. As used herein, the integrated circuit includes a small-scale integration, a medium-scale integration, a large-scale integration, a very-large-scale integration (VLSI), and an ultralarge-scale integration (ULSI).

Figure 22:
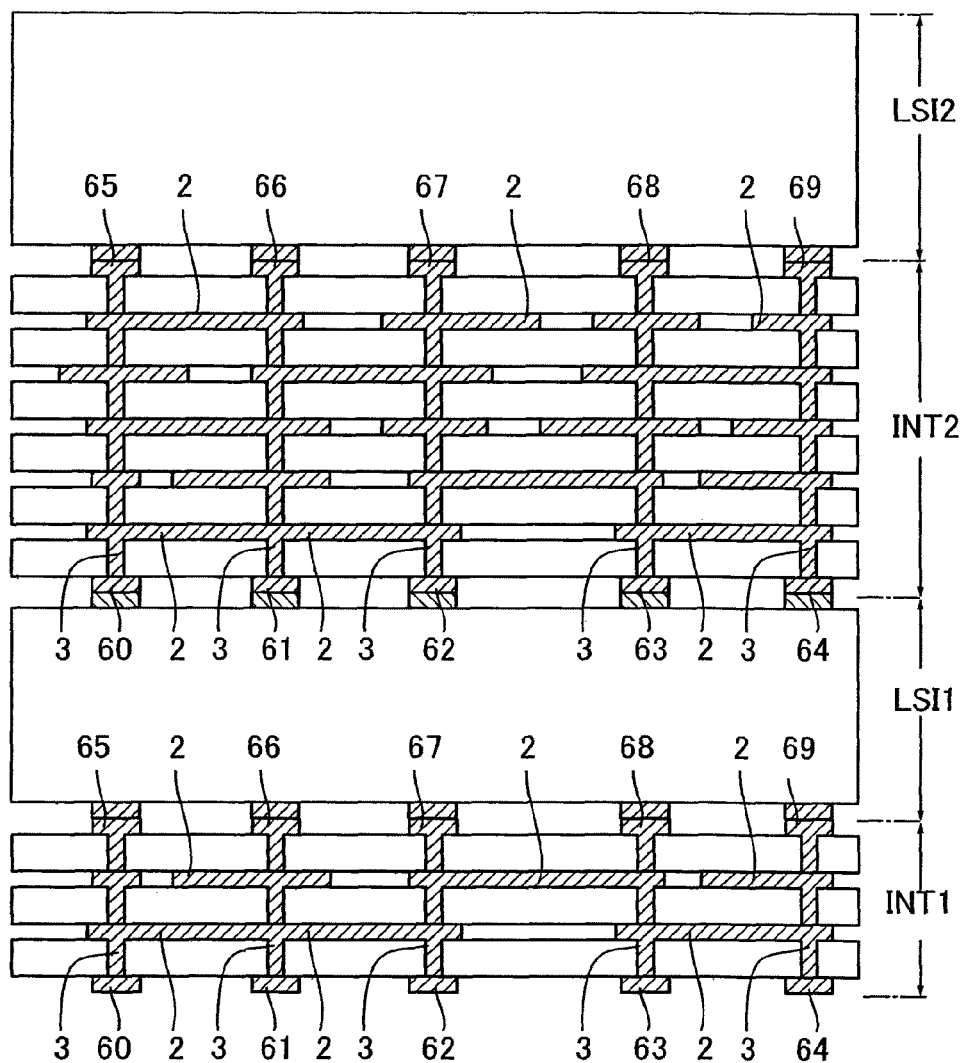
FIG. 22 is a sectional view schematically showing an electronic device according to one embodiment of the present invention.

Referring to FIG. 22, a first integrated circuit LSI1 as a circuit functional part is mounted on one side of a first interposer InT1 adopting circuit boards according to the present invention, a second interposer InT2 adopting circuit boards according to the present invention is mounted on one side of the first integrated circuit LSI1, and a second integrated circuit LSI2 is mounted on one side of the second interposer InT2.

Although FIG. 22 shows only the first and second interposers InT1, InT2, the number, internal wiring, thickness and shape of the interposers are arbitrary. This is also true for the first and second integrated circuits LSI1, LSI2.

Signals from the first integrated circuit LSI1 to the second integrated circuit LSI2 are transmitted to the second interposer InT2 through connections called "bump". Inside the second interposer InT2, the signals are transmitted to target bumps 65 to 69 through the internal wiring 2, 3 and then to the second integrated circuit LSI2 through the bumps 65 to 69. The signal transmission to the underlying first integrated circuit LSI1 can be performed in a similar way.

As shown in FIG. 22, the circuit boards according to the present invention are formed into the first and second interposers InT1, InT2 and then combined with the first and second integrated circuits LSI1, LSI2 into a single chip. This realizes chip size package of electronic circuits being the heart of IT devices and high-speed signal transmission between the first and second integrated circuits LSI1, LSI2.

In addition, the second interposer InT2 disposed between the first and second integrated circuits LSI1, LSI2 enables signals to be transmitted at a high density and a high speed.

In recent CPUs, integrated circuits have an internal clock as high as a few GHz but the clock for transmitting signals to the outside of a chip is only a few hundred MHz, which causes the problem of wiring delay. With the circuit boards according to the present invention being used as the first and second interposers InT1, InT2, however, the wiring length can be minimized to solve the problems due to wiring delay.

Moreover, a delay in a buffer circuit for transmitting signals to the outside and power consumption for driving cannot be ignored. With the circuit boards according to the present invention being used as the first and second interposers InT1, InT2, however, the power consumption can be reduced.

Furthermore, ultraslim, powerful microcomputer systems can be realized by stacking a CPU, a cache/main memory, an IO chip and the like on a single chip.

In FIG. 22, the circuit boards according to the present invention are provided as an independent component from the first and second integrated circuits LSI1, LSI2, but the present invention is also applicable to the internal structure of the first and second integrated circuits LSI1, LSI2, particularly to the local wiring. The present invention is also applicable to the internal wiring structure of not only an active circuit element but also a passive circuit element.

While the present invention has been particularly shown and described with reference to embodiments thereof, it will be understood by those skilled in the art that various changes in form and detail may be made therein without departing from the spirit, scope and teaching of the invention.

What is claimed is:

1. An apparatus comprising:
an electrode, a circuit pattern, and a dispersed area, said electrode being filled in a hole formed in a substrate,
wherein the electrode consists of:
20 wt. % or more of Bi,
30 wt. % or less of In,
Sn, and
1 to 5 wt. % of Cu,
wherein the circuit pattern is made of a thin metal film containing Cu as a main component and is disposed on at least one side of said substrate, and
wherein the dispersed area is an area where the electrode and the circuit pattern are connected via a diffusing metal component included in the electrode and the circuit pattern.

2. A circuit board comprising:
the apparatus of claim 1,
wherein said circuit pattern consists of:
20 wt. % or more of Bi,
30 wt. % or less of In,
Sn, and
1 to 5 wt. % of Cu.

3. A circuit board comprising:
a plurality of substrates stacked in order, at least one of which includes said circuit pattern and said electrode of the apparatus of claim 1,
wherein said circuit pattern consists of:
20 wt. % or more of Bi,
30 wt. % or less of In,
Sn, and
1 to 5 wt. % of Cu.

4. An electronic device comprising:
the circuit board of claim 3; and
a circuit functional part,
wherein said circuit functional part is combined with said circuit board.

5. An electronic device comprising:
the circuit board of claim 2; and
a circuit functional part,
wherein said circuit functional part is combined with said circuit board.

6. The electronic device of claim 4, further comprising:
a sensor module, an optoelectronic module, a field-effect transistor (FET), a metal oxide semiconductor field-effect transistor (MOS-FET), a complementary metal oxide semiconductor field-effect transistor (CMOS-FET), a memory cell, a field complementary (FC), an integrated circuit, or chips thereof.

7. The electronic device of claim 5, further comprising:
a sensor module, an optoelectronic module, a field-effect transistor (FET), a metal oxide semiconductor field-effect transistor (MOS-FET), a complementary metal oxide semiconductor field-effect transistor (CMOS-FET), a memory cell, a field complementary (FC), an integrated circuit, or chips thereof.

8. The circuit board of claim 2, further comprising:
metal particles inserted into the hole in the substrate, the metal particles being adjacent to the circuit pattern,
wherein a noble metal covers a surface of the metal particles.

9. The circuit board of claim 8, wherein the metal particles are magnetic.

10. The circuit board of claim 9, wherein a grain size of the metal particles is 1 μm or less.

* * * * *